United States Patent
Kley

(10) Patent No.: US 7,323,111 B1
(45) Date of Patent: Jan. 29, 2008

(54) ANGLE CONTROL OF MULTI-CAVITY MOLDED COMPONENTS FOR MEMS AND NEMS GROUP ASSEMBLY

(75) Inventor: Victor B. Kley, Berkeley, CA (US)

(73) Assignee: Metadigm LLC, Berkeley, CA (US)

( * ) Notice: Subject to any disclaimer, the term of this patent is extended or adjusted under 35 U.S.C. 154(b) by 369 days.

(21) Appl. No.: 11/048,611

(22) Filed: Jan. 31, 2005

Related U.S. Application Data

(63) Continuation-in-part of application No. 11/046,526, filed on Jan. 28, 2005, now abandoned.

(60) Provisional application No. 60/540,940, filed on Jan. 30, 2004, provisional application No. 60/544,053, filed on Feb. 11, 2004, provisional application No. 60/601,274, filed on Aug. 12, 2004.

(51) Int. Cl.
*C23F 1/00* (2006.01)
*B44C 1/22* (2006.01)

(52) U.S. Cl. .............................. 216/2; 216/17; 216/41; 216/88; 438/689; 438/692

(58) Field of Classification Search .................... 216/2, 216/41, 17, 88, 89; 438/689, 692; 264/45.9
See application file for complete search history.

(56) References Cited

U.S. PATENT DOCUMENTS

| 6,156,243 | A  | * | 12/2000 | Kosuga et al. | ............... 264/2.5 |
| 6,392,313 | B1 | * | 5/2002  | Epstein et al. | ................ 290/52 |
| 2002/0090580 | A1 | * | 7/2002  | Asanuma et al. | ........... 430/321 |
| 2002/0093906 | A1 | * | 7/2002  | Deno et al. | ............... 369/275.1 |

* cited by examiner

*Primary Examiner*—Shamim Ahmed
(74) *Attorney, Agent, or Firm*—Townsend and Townsend and Crew LLP

(57) ABSTRACT

A method of making a mold includes forming spaced mold cavities in a mold body. The mold cavities include geometrically similar portions, but have respective depths below an initial reference surface that vary as a function of position along a particular direction. The mold cavities can be formed using anisotropic etching of preferred crystal directions in single crystal materials such as silicon. A portion of the mold material adjacent the initial reference surface is removed to expose a new reference surface at a tilt angle with respect to the initial reference surface. The modified mold cavities have their respective axes at a new desired tilt angle relative to the new reference surface.

8 Claims, 12 Drawing Sheets

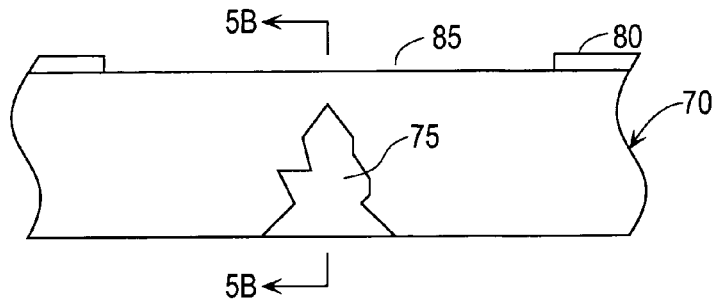
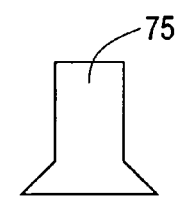
FIG. 5A   FIG. 5B
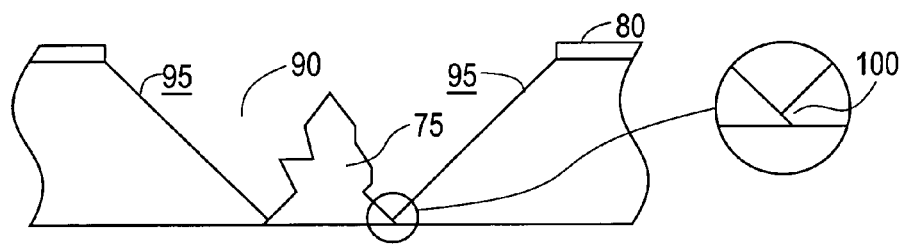
FIG. 5C
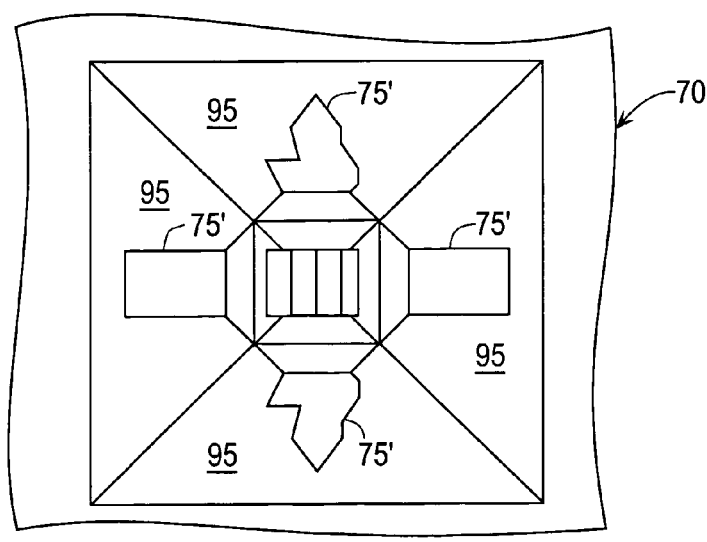
FIG. 5D

ANGLE CONTROL OF MULTI-CAVITY MOLDED COMPONENTS FOR MEMS AND NEMS GROUP ASSEMBLY

CROSS-REFERENCES TO RELATED APPLICATIONS

This application is a continuation-part of U.S. patent application Ser. No. 11/046,526, filed Jan. 28, 2005 now abandoned of Victor B. Kley for "Angle Control of Multi-Cavity Molded Components for MEMS and NEMS Group Assembly," the entire disclosure of which is incorporated by reference, and claims priority to the following three provisional applications, the entire disclosures of which are incorporated by reference:

U.S. Provisional Patent Application No. 60/540,940, filed Jan. 30, 2004 of Victor B. Kley for "Angle Control of Multi-Cavity Molded Components for MEMS and NEMS Group Assembly";

U.S. Provisional Patent Application No. 60/544,053, filed Feb. 11, 2004 of Victor B. Kley for "Angle Control of Multi-Cavity Molded Components for MEMS and NEMS Group Assembly"; and U.S. Provisional Patent Application No. 60/601,274, filed Aug. 12, 2004 of Victor B. Kley for "Angle Control of Multi-Cavity Molded Components for MEMS and NEMS Group Assembly."

BACKGROUND OF THE INVENTION

The present invention relates generally to techniques for molding parts and/or assembling parts and/or releasing parts from molds, including the manufacture and processes for manufacture and assembly of wafer molded and mold grown parts and their assembly on a wafer scale to other parts for NEMS and MEMS. The present invention relates more specifically to techniques for molding parts using block multi-cavity molds and assembling these parts by a mold-to-mold or mold-to-lithographically-constructed-part (or machine) technique, In the description that follows, reference will often be made to diamond as the material being molded. It should be understood that in general, the techniques apply to a variety of other special materials (including cubic boron nitride, silicon carbide, silicon nitride, titanium carbide, titanium nitride, quartz, glass, silicon oxides, chrome and other metals, metal carbides, nitrides, and magnetic and optical materials). Therefore, references to "the diamond" or "the diamond tip" should be read broadly unless the context suggests that diamond's unique properties should limit the reference to diamond.

The use of silicon and other materials to mold or act as growth substrates for diamond and other refractory or special materials has been taught in earlier patent applications and issued patents by this inventor, more particularly U.S. Pat. Nos. 6,144,028, 6,252,226, 6,337,479, 6,339,217, the entire disclosures of which are incorporated by reference.

SUMMARY OF THE INVENTION

The present invention provides techniques, which while of general applicability, find particular applicability to production process for wafer-to-wafer assembly. Thus the invention provides techniques for the precise assembly of semiconductor wafers used to mold diamond or other special materials to other structures such as cantilevers made of silicon, precision metal parts, glass or quartz parts subject to semiconductor, MEMS, NEMS and related precision manufacturing techniques.

While the specific embodiments generally contemplate molded articles that are grown in the mold, various aspects of the invention apply to other types of molded articles, regardless of how the molded article is formed in the mold. Further, while some embodiments exploit the use of self-terminating (also sometimes referred to as self-limiting) etch processes, various aspects of the invention do not require such etch processes.

Setting Bond Angles of Molded Parts

An aspect of the invention provides a technique for setting a complex bond angle between the molded or mold grown part and the structure to which it will be assembled as part of a group assembly. The technique is typically limited only by the size of the starting mold (diameter and thickness). A method of making a mold includes forming a plurality of spaced mold cavities in a mold body having an initial reference surface. The mold cavities include geometrically similar portions, but have respective depths below (into) the initial reference surface that vary as a function of position along a particular direction along the initial reference surface. The mold cavities can be considered to be characterized by a respective plurality of parallel reference axes that are at a particular initial angle (e.g., perpendicular) to the initial reference surface. In some embodiments, the mold cavities are formed using anisotropic etching of preferred crystal directions in single crystal materials such as silicon.

The mold body is then modified by removing a portion of the mold material adjacent the initial reference surface to expose a new reference surface at a tilt angle with respect to the initial reference surface, with the mold cavities now being modified mold cavities. The modified mold cavities are now characterized by having their respective axes at a new desired tilt angle relative to the new reference surface. Further, the variation in depth as a function of position is chosen so that the modified mold cavities have the same respective depths.

When silicon or any crystal material which forms useful atomically accurate surfaces by an etching process is used the angular axis of this structure such a self-terminated pit may be selected by using materials such as silicon cut at a particular angle with respect to crystal axis.

Facilitating Mold Release and Providing In-Situ Inspection

An aspect of the invention provides techniques for releasing a molded part or parts from the mold, possibly after bonding the molded part(s) to a support structure on the mold side of the mold wafer. In short, techniques provide for etching from the opposite side from the mold side, i.e., from the backside, to provide what is referred to as a release pit.

In some embodiments, a small amount of mold material is left near the base of the molded part to protect the support structure from etch fluid or plasma. This amount is small enough to allow the molded part to be separated from the remaining portions of the mold material without requiring excessive force. Where the molded parts have not been bonded to a support structure, the small amount of mold material near the base of the molded parts supports the molded parts, with the remaining portions of the mold material providing protection. In some embodiments, the release pit is self-terminating, in cooperation with the base of the molded part.

In other embodiments, one or more films of silicon oxides, silicon nitrides, or other materials are deposited on the mold side or the supporting structure to which the molded parts are bonded, and act as an etch barrier to protect the supporting structure. In one set of embodiments, the etch barrier layer is provided by a layer of silicon dioxide bonding two wafers of silicon. A pattern etch of the mold side silicon surface is used to create a breakaway groove around the molded part, permitting a lowering of the breakaway force along with a precise limitation of the breakaway pattern of the silicon.

An aspect of the invention permits the in-situ examination of four sides of the molded part by imaging the reflection of the sides of the molded part in the highly reflective and precise mold sides of the release pit.

Alignment and Bonding of Molded Parts to Support Structure

An aspect of the invention provides a technique for aligning a pair of wafers having respective bond sites. Each wafer is provided with a plurality of alignment pits, with the pits on one wafer being registered to the pits on the other wafer. An alignment structure such as a ball is placed in each pit of one of the wafers. The alignment structures and/or one or more of the alignment pit surfaces are sufficiently resilient that as the two wafers are pressed together, the alignment structures align the wafers. For example, where copper balls are used as the alignment structures, they deform as the bond sites on the two wafers come into contact and can be welded or soldered under heat and pressure.

Another aspect of the invention provides an aligned support for small structures such as cantilevers when being assembled or bonded with another wafer carrying rigidly held structures such as diamond tips. When being so used the cantilevers can be displaced away from the bond point by the pressure of the other wafer and by differential strains bending the cantilever at the bond temperature. To overcome this limitation a jig or form is provided with alignment structures that act to stop the released cantilevers and hold them even with their normal (or neutral) position in the cantilever-bearing wafer, or above or below this normal position to set a net positive or negative angle which may serve as the angle offset for the tip-cantilever assembly by creating a wedge of bonding material between the cantilever and the tip or contribute to this offset.

Molding Complex Shapes

Another aspect of the invention provides for using an initial molded part as a seed for further growth through a backside pit. After the initial molded part is formed in a mold cavity on the mold side of the wafer, a pit of desired configuration is formed on the backside to expose the end of the initial molded part closest to the backside. Further material (e.g., diamond, silicon nitride, cubic boron nitride) is grown using the exposed end of the initial molded part. This way, a molded part not otherwise easily achievable with a single mold or growth operation is achieved. For example, very small diameter shapes on the ends of larger shapes (the initial molded parts) can be obtained.

Another aspect of the invention provides for using an initial molded part as a seed for further growth through a backside pit. In this case, the growth is not confined to a narrow pit, but rather electric fields are used to control the growth in an angled backside pit.

Ejection from Mold

Another aspect of the invention provides techniques for ejecting molded parts from the mold. In embodiments, the mold wafer with molded parts formed therein has been subjected to a backside etch to leave a small amount of mold material surrounding the base of the molded part and the molded part substantially exposed from the backside. One version uses an ejection tool having protrusions that are aligned with a suitable feature on the molded parts. The ejection tool is positioned so the protrusions engage the molded parts, and then moved a controlled distance to rupture the mold material retaining the molded part(s). Another version uses hydraulic pressure to eject the molded parts from the mold. A source of hydraulic fluid is sealed to the backside of the wafer and pressurized to rupture the mold material retaining the molded part(s).

Workpiece Alignment

An aspect of the invention provides an alignment wafer configuration that facilitates the fabrication of aligned parts. This process assumes a workpiece having a shaped end, which when severed from the major portion of the workpiece, will define a small part. The preshaped end of the workpiece may be oriented in crystal axis to align the shape as a cutting edge with a preferred axis for that cutting operation such as <100> or <110> or <111> or any particular precise crystal orientation desired. Multiple such workpieces are contemplated.

One side of the alignment wafer (corresponding in some sense to the mold side) is formed with a recess that conforms to the shaped end of the workpiece, but the other side of the wafer (corresponding in some sense to the back side) is formed with a recess so that the end of the workpiece, when it is inserted into the mold-side recess, passes into the backside recess, but is stopped before it extends past the backside. Multiple such workpieces are inserted into corresponding mold-side recesses, and they are then all cut in place by the operation of one focused laser cut or abrasive wire or chemical etch. These aligned parts can then be prepared for bonding to another wafer with corresponding support structures, or can be removed from the alignment wafer for such further handling as desired.

A further understanding of the nature and advantages of the present invention may be realized by reference to the remaining portions of the specification and the drawings.

A further understanding of the nature and advantages of the present invention may be realized by reference to the remaining portions of the specification and the drawings.

BRIEF DESCRIPTION OF THE DRAWINGS

FIGS. 5A and 5C are schematic cross-sectional views of the release of a mold wafer from a molded part;

FIG. 5B is a schematic cross-sectional view of the molded part taken through line 5B-5B of FIG. 5A;

FIG. 5D is a schematic top view of the mold wafer and molded part at the stage of the wafer shown in FIG. 5C, illustrating the opportunity to inspect four sides of the molded part before it is finally released from the mold;

DESCRIPTION OF SPECIFIC EMBODIMENTS

Overview and Terminology

Figure 1A:
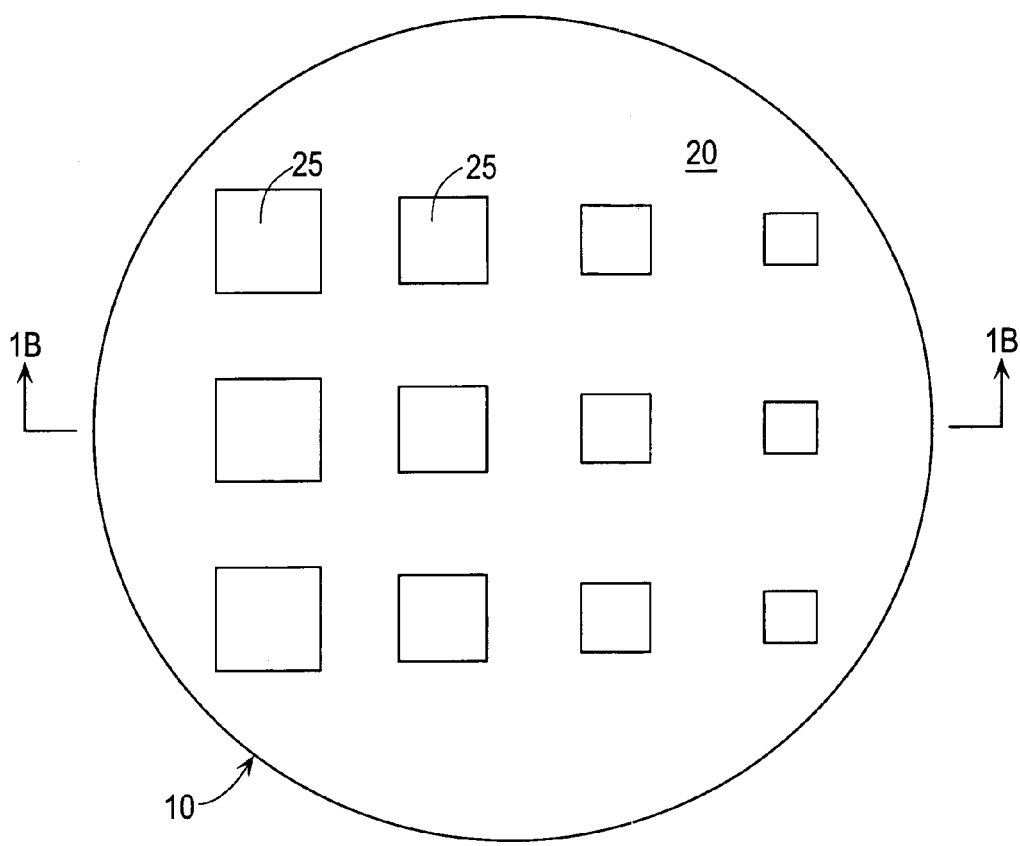
FIGS. 1A and 1B are schematic top and cross-sectional views of a mold wafer in an early stage of mold fabrication.

In general, the invention provides techniques related to molded objects, typically using mold wafers. In the context of this application, the term "molding" is intended to cover growing objects in a mold as well as otherwise introducing material into a mold cavity or onto a mold surface. Thus the term "molded part" is intended to cover mold-grown parts, and vice versa.

In its various aspects, the invention provides techniques for one or more of: setting a complex bond angle limited only by the size of the starting mold (diameter and thickness); removing the silicon or other mold material while maintaining support for a film or other barrier that protects susceptible structures on the mating part to be bonded; inspecting molded parts while they are still in the mold; aligning parts to be bonded (e.g., a wafer mold of containing molded parts to a wafer of structures to which the molded parts are to be bonded; ejecting molded parts from a mold; forming specialized shapes by molding from both sides of a mold wafer; using films of silicon oxides, silicon nitrides, or other materials to act as an etch barrier to protect structures to which the molded parts are mounted; and/or In a particular embodiment, the molded parts are diamond (or one of the other special materials noted above) and are assembled onto cantilevers for use in a scanning probe microscope (SPM) or other use similar use such as nanoindentation and nanomachining. These cantilevers in general are tilted at a fixed angle with respect to surface they scan, typically 3 degrees to 15 degrees. In some implementations, the diamond is grown into the mold as a single crystal, while in other implementations, the diamond is grown into mold shapes as oriented polycrystalline material.

Additionally, while particular embodiments use silicon wafers for the mold, techniques according to different aspects of the invention may be used in connection with other mold materials such as sapphire, quartz, or alumina. If necessary wafers, especially wafers used for assembly jigs and the like, can be overcoated with an anti-wear and anti-stick film such as silicon nitride In portions of the description that follows, references will be made to directions such as up and down. The invention is not limited to any orientations or directions unless specifically noted, and references to directions or orientations are with respect to the figures and are for convenience only.

Setting Bond Angles of Molded Parts

In this section, the formation of a mold body with mold cavities at a desired angle with respect to a reference surface will be described. In an illustrative embodiment, the mold cavities will be four-sided pyramids with their axes at an angle to a reference surface. In the embodiment described below, the mold cavities are created in a semiconductor wafer using known photolithographic processing techniques. As a matter of nomenclature, the side of the wafer in which mold cavities have been formed is sometimes referred to as the mold side, and the other side is sometimes referred to as the backside.

Figure 1B:
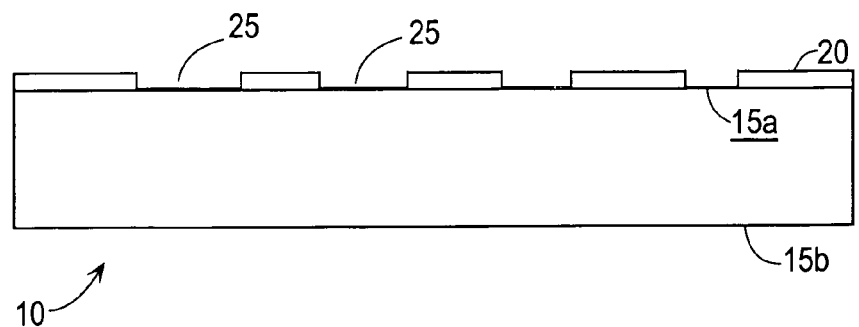

FIGS. 1A and 1B are schematic top and cross-sectional views of a mold wafer 10 in an early stage of mold fabrication. The drawing is not to scale, with the thickness of the wafer and the spacing and size of various features greatly exaggerated Mold wafer 10, portions of which will define the mold body, is shown with top and bottom surfaces 15a and 15b, respectively. In these figures, the top surface will, after suitable processing to be described, become the mold surface.

In a specific embodiment, the wafer is a 1-0-0 silicon wafer with top surface 15a defining an initial reference surface, which for a 1-0-0 wafer is parallel to the {100} planes. The mold wafer has an etch stop layer 20 of silicon oxide that has been lithographically patterned to form a plurality of openings 25 that expose bare silicon. Openings 25, which will help define the mold cavities, are not of uniform size, but rather are have geometrically similar shapes (squares in the illustrated embodiment) with a size that varies as a function of position on the wafer. In particular, the squares can be seen as decreasing in size moving from left to right.

Figure 2A:
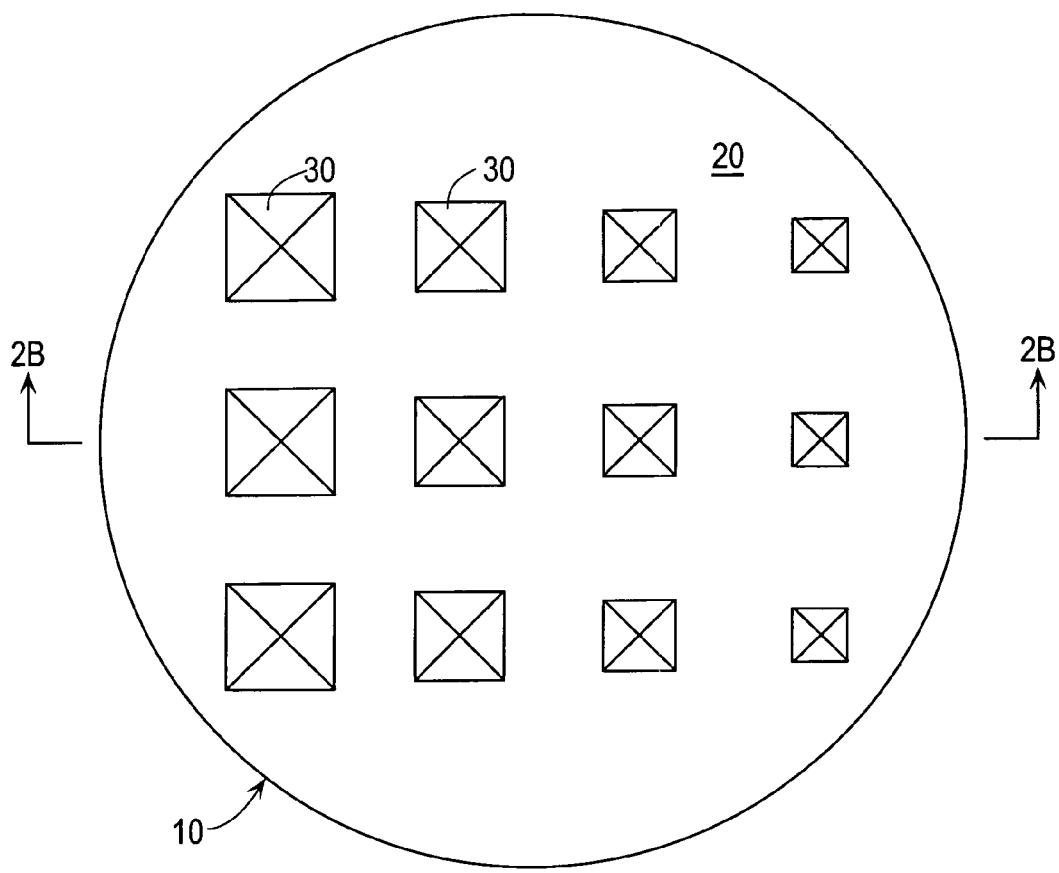
FIGS. 2A and 2B are schematic top and cross-sectional views of the mold wafer at a later stage of mold fabrication.
Figure 2B:
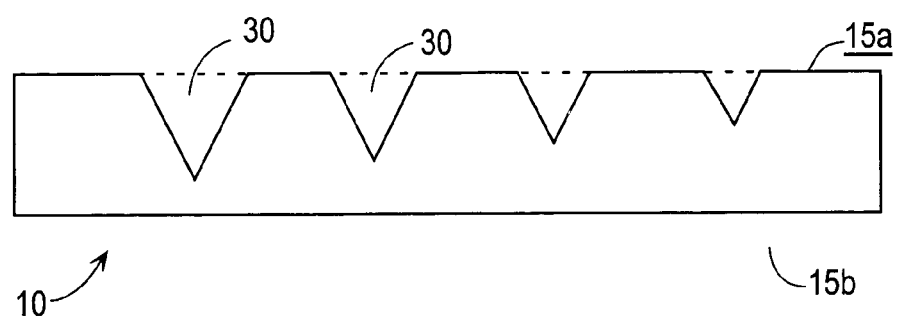

FIGS. 2A and 2B are schematic top and cross-sectional views of mold wafer 10 at a later stage of mold fabrication. At this stage, the patterned side of the wafer has been subjected to an anisotropic etch to produce cavities 30 in the wafer that will further help define the mold cavities. As is well known, potassium hydroxide (KOH) preferentially etches in the <100> and <110> directions relative to the <111> direction, in single-crystal silicon, thereby creating an anisotropic etch.

Where the etch stop pattern exposes bare silicon squares, and an etchant such as potassium hydroxide is used, the etch will self-terminate as a pyramid, ending in a point with the depth of the pyramid depending precisely on the starting size of the square. (In the case where the etch stop pattern would expose non-square silicon rectangles, the etch would self terminate to a house roof shape with quadrilateral faces forming the main roof and triangular faces forming the ends, with a knife edge taking the place of the single point of the pyramid. The length of the knife edge is precisely related to the amount the rectangle departs from a square, limiting to the point for a perfect square.)

Thus in this particular example, cavities 30 are geometrically similar pyramids having respective square bases (in the plane of top surface 15a) and respective apices opposite the centers of the respective squares. The depth and base of each pyramid relative to the initial reference surface vary as a function of position along a particular direction along the initial reference surface. More generally, the cavities can be considered to include geometrically similar portions, but have respective depths below (into) the initial reference surface that vary as a function of position along a particular direction along the initial reference surface. These cavities are further characterized by a respective plurality of parallel reference axes that are at a particular initial angle to the initial reference surface (top surface 15a).

Figure 3A:
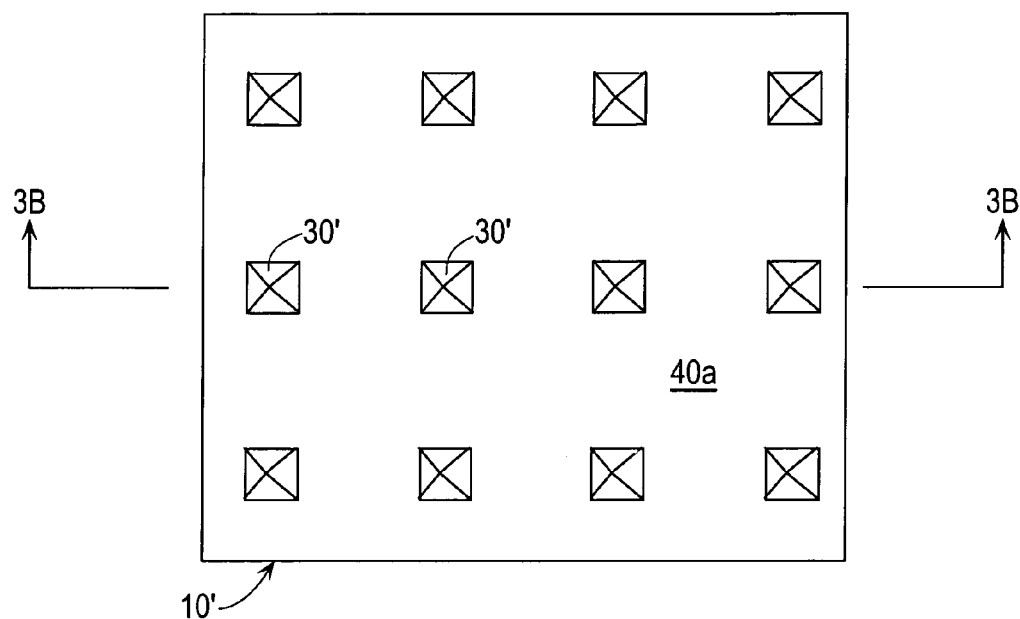
FIGS. 3A and 3B are schematic top and cross-sectional views of the mold wafer at a generally final stage of mold fabrication.
Figure 3B:
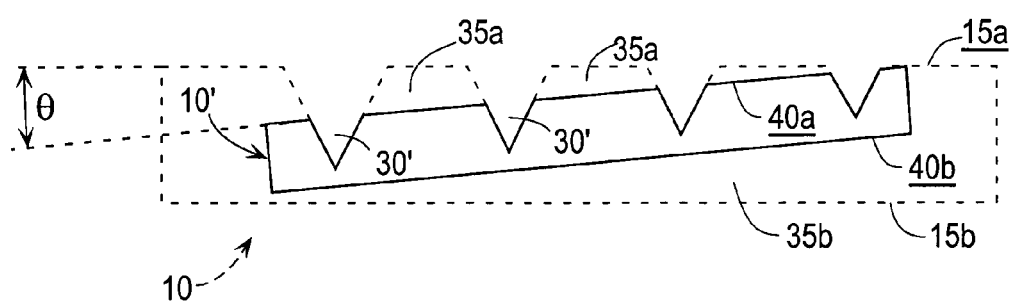

FIGS. 3A and 3B are schematic top and cross-sectional views of the mold wafer at a generally final stage of mold fabrication. At this stage, the mold body has been modified, as designated by the reference numeral 10', with the original wafer 10 and cavities 30 shown in phantom. The main functional modification is the removal of a portion 35a of the mold material adjacent the initial reference surface to expose a new reference surface 40a at a desired tilt angle θ with respect to initial reference surface 15a, with the mold cavities, designated 30', now being modified mold cavities. The modified mold cavities are now characterized by having their respective axes at the desired tilt angle θ relative to the new reference surface 40a. Further, the variation in depth of the original cavities 30 as a function of position is chosen so that the modified mold cavities 30' have the same respective depths.

In the specific illustrated embodiment, the mold body has been additionally modified (a) by removing a portion 35b of the mold material adjacent the initial lower surface 15b to expose a new lower surface 40b, and (b) by removing peripheral portions of the wafer. Where new lower surface 40b is also at the desired tilt angle θ with respect to initial lower surface 15b, the upper and lower surfaces are parallel to each other. This step is also referred to as a grind-back step.

Once the mold has been fabricated as described above, diamond or any other material may be grown or otherwise introduced into the mold, to provide a plurality of molded parts having desired tilt angles to the reference surface of the mold body. However, various techniques to be described below, including mold release, in-situ inspection, and wafer alignment techniques, can be used with other types of molds or with molds fabricated using other methods.

The above technique for providing mold cavities whose axes are tilted with respect to the mold surface has the advantage that a standard wafer (e.g., a 1-0-0 silicon wafer) can be used. In an alternative embodiment, suitable only for self-terminating shapes, the wafer material is cut from the single crystal boule at the desired tilt angle with respect to {100} to obtain the desired tilt angle. In the other uses such as dry or isotropic etching in which the mold is prepared without regard for crystal orientation, the additional grind-back step discussed above is a requirement regardless of the actual crystal axis of the wafer.

Figure 4A:
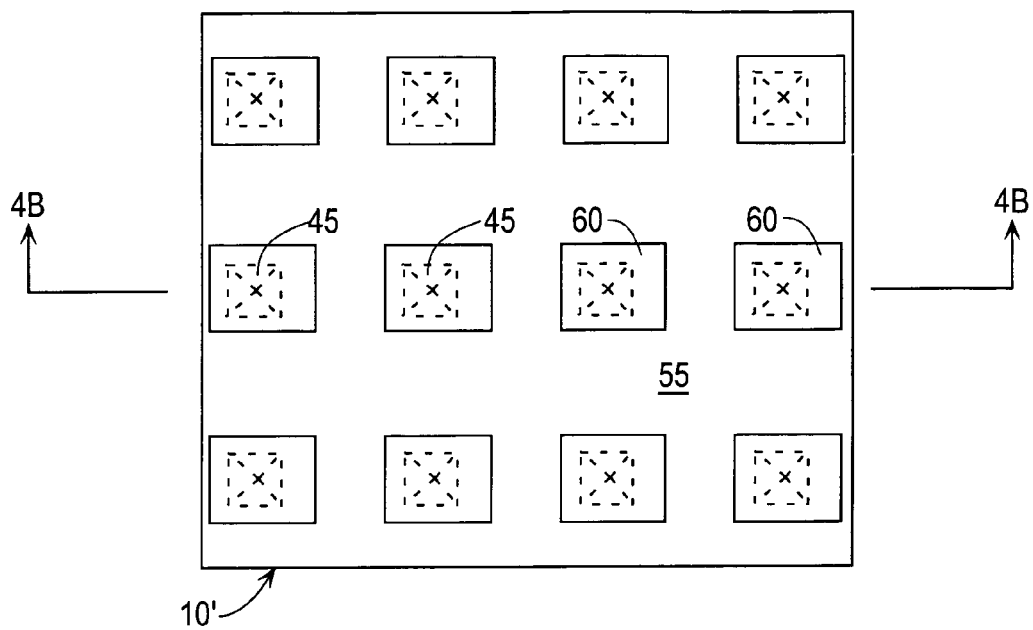
FIGS. 4A and 4B are schematic top and cross-sectional views of an early stage of release of a mold wafer from an array of molded parts.
Figure 4B:
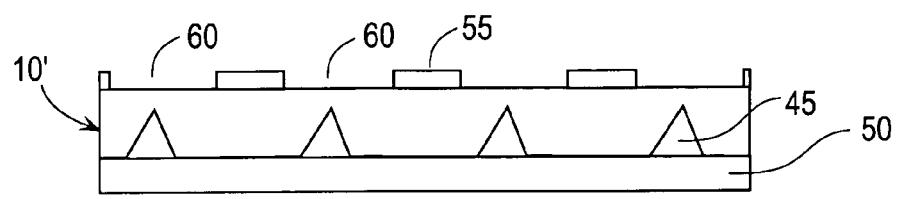

Facilitating Mold Release and Providing In-Situ Inspection
  Use of Backside Etch Pits for Release FIGS. 4A and 4B are schematic top and cross-sectional views of an early stage of mold release according to an embodiment of the present invention. For purposes of example, mold wafer 10' shown in FIGS. 3A and 3B is shown in FIGS. 4A and 4B as having been used as a mold to form molded parts 45, which have been aligned with and bonded to a separate support structure 50. In the case where the molded parts are SPM tips, the separate structure can be a wafer of cantilevers, or can be any other structure to which such tips might be advantageously bonded. The techniques for facilitating mold release do not depend on the molded parts having been bonded to support structures, but would also be workable for molded parts that have not been so bonded.

The mold with parts 45 and structure 50 is shown as having been flipped over relative to the orientation of FIGS. 3A and 3B. Thus the backside is the upper surface in these figures. The backside of the mold wafer has been provided with an etch barrier layer 55, which may be silicon oxide or silicon nitride, that has been lithographically patterned to form a plurality of openings 60 that expose bare silicon. Molded parts 45 are shown in phantom in FIG. 4A. Since the mold of FIG. 3B has, by design, the crystalline axes tilted with respect to the mold surfaces, openings 60 are offset from the bases of the molded parts to account for the tilt. If the mold had been fabricated from a wafer solely by anisotropic etching without the subsequent removal of material to provide a new tilted reference surface, openings 60 would most likely be centered relative to the bases of the molded parts.

Figure 4C:
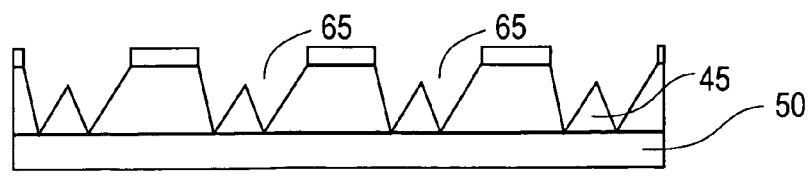
FIGS. 4C and 4D are schematic cross-sectional views of later stages of the release.

FIG. 4C shows the result of subjecting the patterned backside of mold wafer 10 to an anisotropic etch using an anisotropic etch process that is analogous to the etch process with which the mold cavities were formed. In order to facilitate removal of the mold material, openings 60 should be large enough relative to the thickness of the mold material to permit a sufficiently deep etch since the etch is self-terminating. The result of this etch is a series of etch pits 65, which are referred to as release pits.

Figure 4D:

FIG. 4D shows the result of separating the residual mold material from molded parts 45 and support structure 50.

It is typically desired to protect support structure 50 from the etch fluid or plasma; this can be accomplished in a number of ways. One approach is providing an etch stop coating to the mold side of the mold wafer and molded parts before bonding them to the support structure, and/or providing an etch stop coating to the support structure before it is bonded to the mold wafer and molded parts. This is a viable approach as long as the etch stop coating does not interfere with the bonding process. Other, and sometimes preferred, approaches will be discussed below with reference to FIGS. 5A-5D and 6A-6B.

Use of Self-Terminating Backside Etch Pits for Release

FIGS. 5A-5C illustrate a technique that exploits the self-terminating property of some etch processes as applied to some mold materials (e.g., a potassium hydroxide etch as applied to 1-0-0 silicon wafers). In one set of embodiments, openings 60 are sized to form a self-terminated etch pit (release pit) with sloped sides using an anisotropic etch process that is analogous to the etch process with which the mold cavities were formed.

FIG. 5A is a schematic cross-sectional view of a portion of a mold wafer 70 (say a 1-0-0 wafer) which has been used as a mold to form one or more molded parts 75. Mold wafer 70 is shown as having been provided with an etch barrier layer 80, e.g., a layer of silicon oxide, that has been lithographically patterned to form one or more openings 85 that expose bare silicon over the molded part(s). While the technique could be used with a mold wafer having surfaces at a tilt angle relative to the {100} planes, such as described above, the technique has wider application.

FIG. 5B is a cross-sectional view of molded part 70 taken through line 5B-5B of FIG. 5A. In this particular example, for illustrative purposes, the molded part has a jagged outline in one plane, but a rectangular outline in the perpendicular plane, as if extruded. The base of the molded part is a truncated four-sided pyramid, in a specific case having angles of 54.7° relative to the base (corresponding to the characteristic angle formed by the anisotropic etch.

FIG. 5C shows the result of subjecting the patterned side of mold wafer 70 to an anisotropic etch that forms a self-terminating release pit 90 with walls 95. In this embodiment, the size of opening(s) 85 is chosen so that the etch self terminates before reaching the bottom of the wafer. This leaves a small amount of the mold material 100 surrounding and overlying the outer portion of the molded part's base (see enlarged inset). The thickness of mold material 100 at the edge of the molded part's base is small enough to allow moderate mechanical force to cause the mold material to fracture without compromising the bond. The thickness of mold material 100 is large enough, however, to protect the support structure from the etchant fluid or plasma without requiring a separate protective layer.

In the specific case where the molded part's geometry is defined by the nature of the anisotropic etch process (mold material and anisotropy parameters), it is straightforward to make the release etch self-terminating. To extend the technique to a general class of molded shapes, one need only provide that the molded part's base forms part of a self-terminated shape. Further, mold wafer 70, at the stage of processing shown in FIG. 5D, provides a convenient way to store and/or transport the molded parts prior to mounting them on a support structure.

In the particular case of a diamond pyramidal tip formed and bonded to a 50-micron thick cantilever, the pyramidal depression (65, 90) is etched to release the diamond such that the etch terminates on the molded part itself, and stops at 5 microns from going completely through the mold wafer. This method has the added advantage that the rectangle or square etch region can be chosen exactly to match the measured thickness of the wafer so as to obtain exactly the remainder thickness appropriate to the use.

FIG. 5D is a top view of mold wafer 70 and molded part 75 at the stage of the wafer shown in FIG. 5C, illustrating the opportunity to inspect four sides of the molded part before it is finally released from the mold. Walls 95 of release pit 90 have the property, particularly in a 1-0-0 silicon wafer (and partially off axis-single crystal silicon), of being highly reflective optically. Thus each of the pit walls forms a virtual image 75' of the side of molded part facing that pit wall. Thus by suitable focus of a standard incident light microscope the side of the molded part facing the pit wall is visible in reflection from the wall and indeed in many cases all four pits walls show a visible image of the molded side from that view. Thus with one image all four sides of the molded part may be viewed and/or inspected at once.

Use of Backside Release Pit with Etch Stop Layer and Mold-Side Breakaway Groove

Figure 6A:
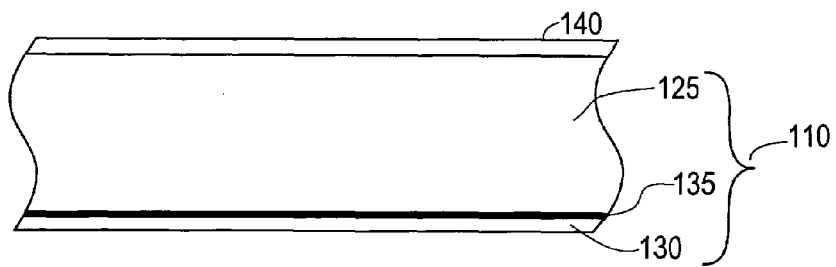
FIGS. 6A-6E are schematic cross-sectional views showing the fabrication of a mold wafer with a breakaway, and the molding and releasing of a molded part in an embodiment of the present invention.

FIGS. 6A-6E are schematic cross-sectional views showing the fabrication of a mold wafer 110 with a narrow breakaway groove 115, and the molding and releasing of a molded part 120 in another embodiment of the present invention. The upper surface of the mold wafer is the backside in FIGS. 6A-6E. As can be seen in FIG. 6A, the mold wafer comprises an upper wafer 125 and a lower wafer 130 (device layer), which are bonded together by a silicon oxide layer 135 (shown as a heavy line). The upper wafer is relatively thick and provides most of the volume of the mold cavity. Oxide layer 135 acts as an etch stop layer for the mold release as will be further described. Upper wafer 125 is provided with an etch barrier layer 140 on the backside, which corresponds generally to etch barrier layer 55 (shown in FIGS. 4A-4C) and etch barrier layer 80 (shown in FIGS. 5A and 5C). For simplicity, etch barrier layer is shown as having been formed early in the process, but it may be provided at other stages.

Figure 6B:
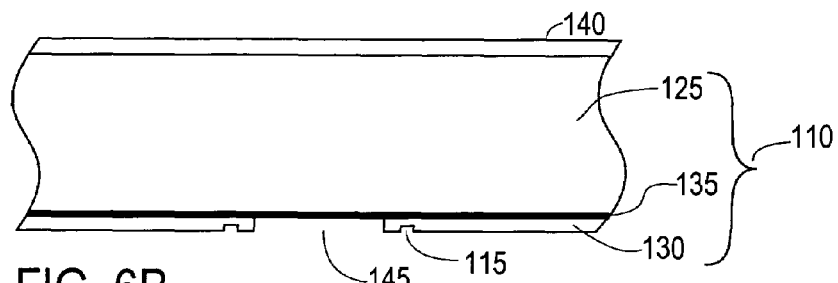

FIG. 6B shows lower wafer 130 having been subject to process steps that result in two features, namely a mold opening 145 and breakaway groove 115 surrounding mold opening 145. A representative process is as follows. First the bottom wafer is patterned and etched part of the way through to define the breakaway groove. The depth is selected to require a desired breakaway force to fracture wafer 130 along the groove. A typical groove would be on the order of 3 to 4 times the depth, and a typical depth would be on the order of 20 microns on a 40-micron thick device layer. Then the groove is protected from further etching by a suitable resist (not shown). Lower wafer 130 is then provided with an etch-resistant layer that is patterned to define mold opening 145, and the exposed silicon is dry etched to oxide layer 135.

Figure 6C:
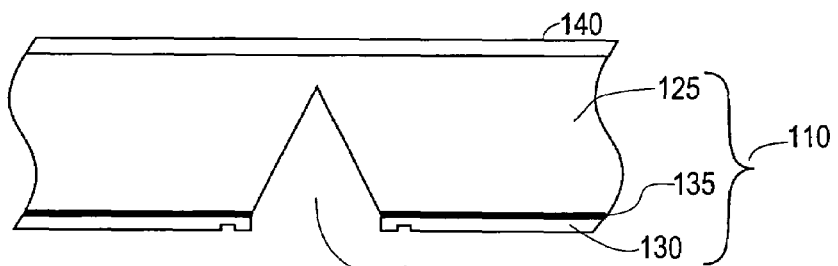

FIG. 6C shows the exposed oxide in mold opening 145 having been etched with an oxide-selective etchant such as dilute hydrofluoric acid or buffered oxide etch (BOE) to expose the silicon in the mold opening, This is followed by an anisotropic etch (e.g., potassium hydroxide) to form a mold cavity 150.

Figure 6D:
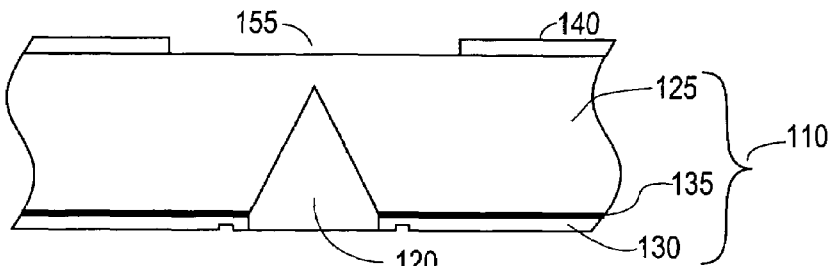

FIG. 6D shows molded part 120 having been formed by growing diamond, silicon nitride, silicon carbide, or other appropriate material in the mold cavity. FIG. 6D also shows an opening 155 having been formed in etch barrier layer 140.

Figure 6E:
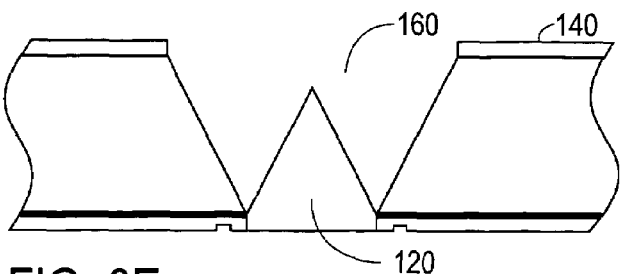

FIG. 6E shows the effect of etching the portion of wafer 125 exposed by opening 155. This is preferably an anisotropic etch along the lines of the etch used to etch the mold cavity, as was described in connection with the embodiments shown in FIGS. 4A-4C and FIGS. 5A and 5C. The result is a release pit 160 surrounding molded part 120 and extending down to and being limited by oxide layer 135, which as mentioned above acts as an etch stop layer.

Figure 6F:
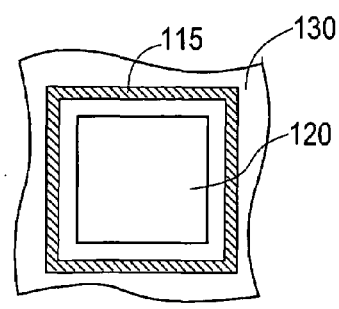
FIG. 6F is a schematic bottom view of the mold wafer and molded part.

FIG. 6F is a bottom view showing breakaway groove 115 (shown with cross-hatching), the base of molded part 120, and surrounding portions of the lower surface of lower wafer 130. At this point, processed mold wafer 110 with molded part(s) 120 can be stored or transported with the remaining surrounding portions of the mold wafer providing support and protection for the molded part(s) until such time as bonding the molded part(s) to a support structure is desired.

As mentioned above, molding diamond in silicon wafer molds is only an example. As further examples, for this and other embodiments, the silicon or sapphire or quartz or alumina mold material for original molding of the diamond or silicon nitride or silicon carbide may be prepared on a silicon or other material wafer in which a stop layer is incorporated such as silicon oxide, carbide or nitride or other material well known in the art. This layer may then be used as a stop layer when back etching a release pit around the molded part.

Alignment and Bonding of Molded Parts to Support Structure

Captured Alignment Structures

Figure 7A:
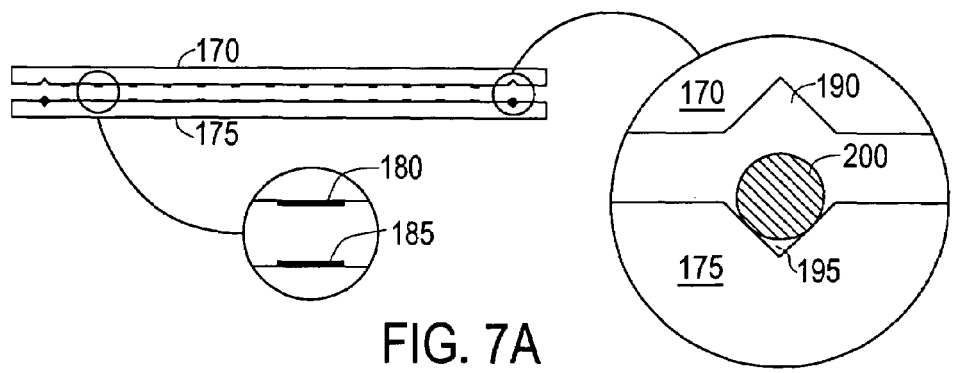
FIGS. 7A-7C are schematic cross-sectional views showing an alignment and bonding technique in an embodiment of the present invention.
Figure 7B:
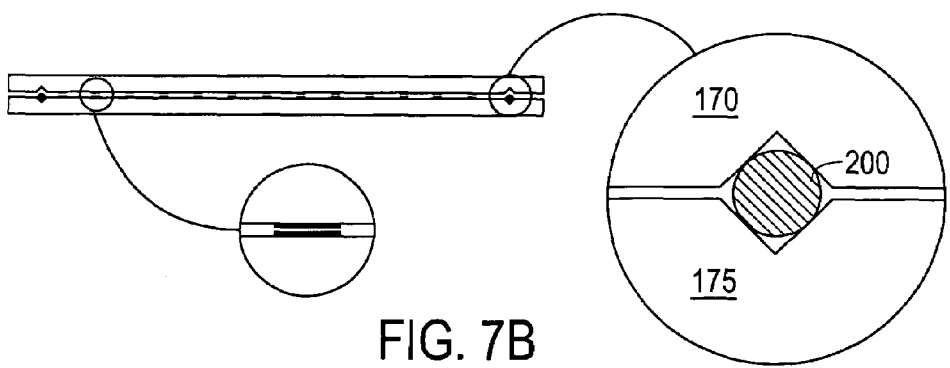
Figure 7C:
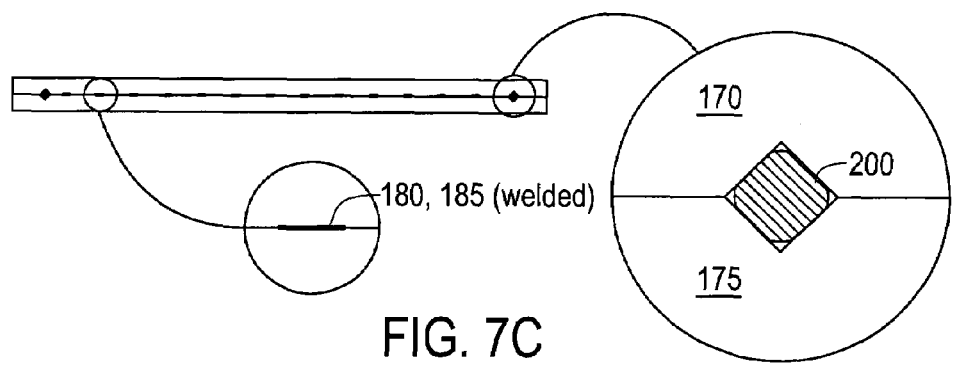

FIGS. 7A-7C are schematic cross-sectional views showing a technique in an embodiment of the present invention for aligning a pair of wafers 170 and 175 having respective pluralities of bond sites 180 and 185. The bond sites on one wafer may, for example, be associated with molded parts such as cantilever tips, while the bond sites on the other wafer may be associated with cantilevers or other support structures. The technique does not depend on the particular form of bonding, but for purposes of illustration, the bond sites may be occupied by lithographically patterned sandwiches of titanium-nickel-copper, with the facing copper surfaces effecting a weld when subjected to pressure and heat. For simplicity, the molded parts are not shown.

To facilitate alignment, each wafer is provided with a set of alignment pits, designated with reference numerals 190 and 195 for wafers 170 and 175, respectively. Each set of alignment pits has two or more (typically three to six) pits disposed along the edges of the wafer. Two such pits are shown for each wafer. In the embodiment of FIGS. 7A-7C, the alignment pits are self-terminated cavities, such as those created for the mold cavities by anisotropic etching as described above. These alignment pits are generally larger is size than at least some types of molded parts. For example, the alignment pits might have dimensions on the order of hundreds of microns while the molded parts may have dimensions on the order of tens of microns.

An alignment structure such as a precision ball 200 is place in each of alignment pits 195. The ball may be made of copper, silver, or some other deformable material. FIG. 7A shows the wafers spaced from each other by an arbitrary distance. FIG. 7B shows the wafers having been brought close enough so that balls 200 are seated in pits 190 and 195. The balls and alignment pits are sized relative to each other such that when the balls are seated in the upper and lower pits, the bond sites do not touch. While dimensions are not critical, a representative embodiment has balls having diameters of 254±1 microns, with the pits being sized to leave a space of 20 microns between the wafers when the balls are seated in the alignment pits.

FIG. 7C shows the wafers having been brought together under pressure and heat. The balls deform while maintaining the alignment, thereby ensuring that bond sites 180 and 190 are precisely registered as they come in contact and are welded together.

Figure 7D:
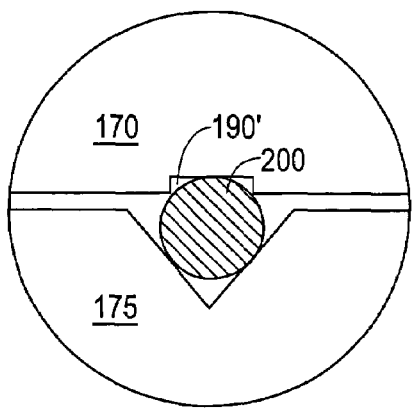
FIG. 7D is a schematic cross-sectional view showing a variation on the embodiment shown in FIGS. 7A-7C.

FIG. 7D shows an alternative arrangement where the lower pits are self-terminating shapes as noted above, but the upper pits, designated 190', are etched relatively shallow rectangular cavities with vertical sidewalls. A depth of 50 microns is typical, and the balls and lower alignment pits are sized accordingly to leave a 20-micron separation between the wafers when the balls contact the upper and lower alignment pits.

In an alternative arrangement, suitable for use with either of the two geometries described above is to use non-deforming balls, such as stainless steel, silicon nitride, silicon carbide (or other hard material), and provide one or both sets of alignment pits with a coating of a thermally softenable material (e.g., copper, silver, or tin) to allow the wafers to come together after the balls are seated in the upper and lower pits. In yet another arrangement, deformable coatings in the pits and deformable balls are used.

Jig with Alignment Posts

Figure 8:
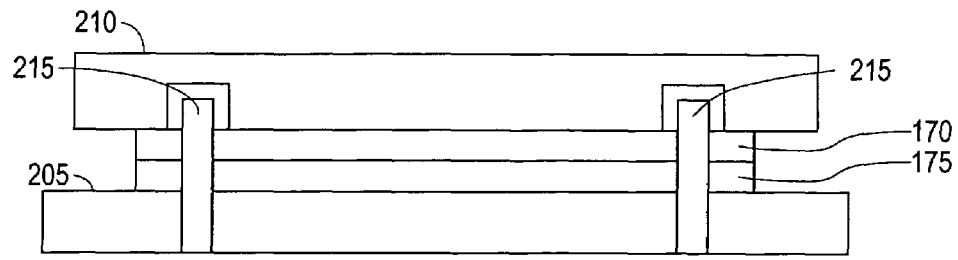
FIG. 8 is a schematic cross-sectional view of an assembly jig for aligning and bonding wafers.

FIG. 8 is a schematic cross-sectional view of an assembly jig for aligning and bonding wafers, such as wafers 170 and 175 described above in connection with FIGS. 7A-7D. The jig includes a base 205 that supports the two wafers to be aligned and a weight 210. The base has a number of posts 215 (e.g., three, two of which are shown) that are made of a suitable material like sapphire and sized and positioned in correspondence with through holes in the wafers to be aligned. Since it is generally desired to place the aligned wafers in a furnace for bonding, base 205 and weight 210 preferably have similar coefficients of thermal expansion (CTE) to the wafers. Thus silicon would be the preferred material for use with silicon wafers. Weight 210 is shown as having recesses to accommodate the posts, but could also have recesses. The jig thus allows the wafers to move as required in z while maintaining alignment in x and y to complete the bond in the desired manner.

The jig can be used as the sole alignment mechanism or it can be used in conjunction with a mechanism described above in connection with FIGS. 7A-7D. In the latter instance, the jig could provide a relatively coarse alignment, with the balls in the pits providing the fine alignment.

Alignment with Tilt Angle Set During Bonding

Figure 9A:
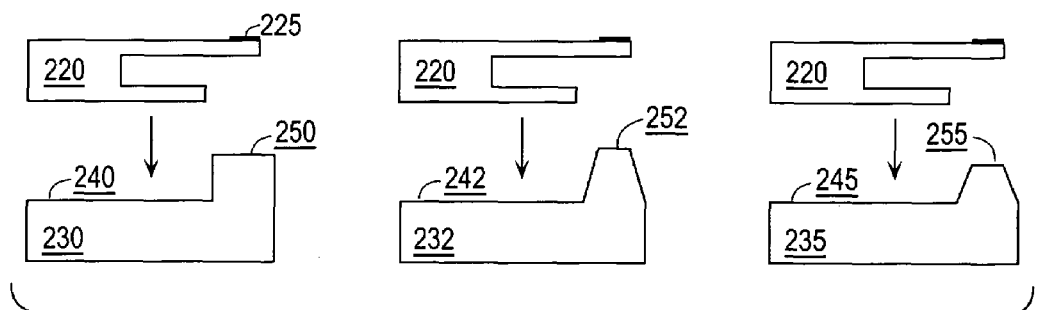
FIGS. 9A-9C show schematically an alternative way to bond tips where a desired tilt angle is established at the time of bonding.
Figure 9B:
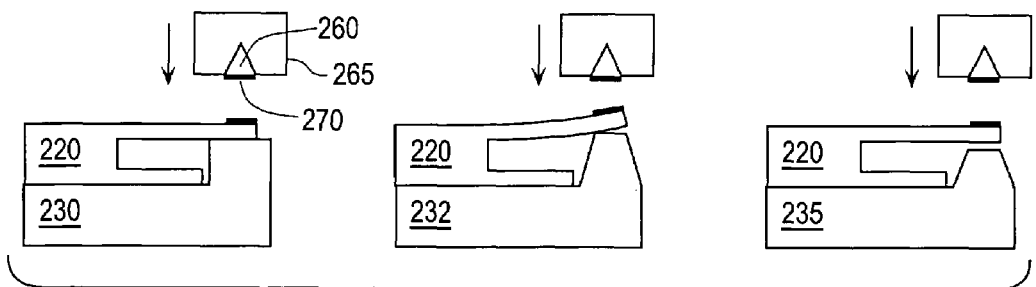
Figure 9C:
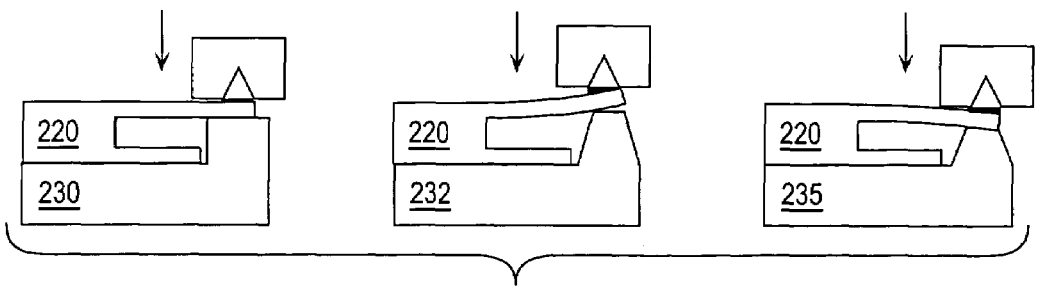

FIGS. 9A-9C show an alternative way to bond tips where a desired tilt angle is established at the time of bonding. Each figure has three parts; the left part shows a setup for a normal bond angle, the middle part shows a setup for one direction of tilt, while the right part shows a setup for the other direction of tilt. Cantilevers 220 are shown with bond material 225 (e.g., exposed copper for welding, a solder material, or a resin material). Three different support structures 230, 232, and 235 are shown. The support structures have respective lower land surfaces 240, 242, and 245 for engaging the base of the cantilever, and respective upper land surfaces 250, 252, and 255 for engaging the bottom of the arm of the cantilever. The support structures differ from each other by having their respective upper land surfaces 250, 252, and 255 at different heights above their respective lower land surfaces 240, 242, and 245.

FIG. 9A shows the cantilevers above the support structures. FIG. 9B shows the cantilevers seated on the respective lower land surfaces of the support structures with a downward force having been exerted on the cantilevers. It will be noticed that the cantilever arm engages upper land surface 250 without bending the cantilever; the cantilever arm engages upper land surface 252 before the base engages lower land surface 242, so that the arm is bent upwardly; the cantilever base engages lower land surface 245 before the cantilever arm engages upper land surface 255, thereby leaving a gap. Molded parts 260 in mold wafers 265 are to be bonded to the cantilevers, and for this purpose have bond material 270 on their bottom surfaces.

FIG. 9C shows the mold wafers having been pressed down on the cantilevers. The cantilever in the left part of the figure remains horizontal, so the molded part is bonded with no nominal tilt between its bottom surface and the top of the cantilever arm surface. The cantilever in the middle part of the figure has been tilted upwardly by the excess height of upper land surface 252, so the molded part is bonded with a nominal tilt between its bottom surface and the top of the cantilever arm surface. The cantilever arm in the right part of the figure has remained spaced from upper land surface 255 and is forced down against upper land surface 255 so that it curves downwardly, so the molded part is bonded with a nominal tilt between its bottom surface and the top of the cantilever arm surface, but in the opposite direction from the molded part in the middle part of the figure. Thus, support structures 230, 232, and 235, by virtue of their different upper land surface heights, leave horizontal, lift, or lower the cantilever end. This causes the bond material to form an even slab, or to wedge wide to the right or left. Since molded part 260 is rigidly held and unreleased from mold wafer 265 during the bonding, when the part is released and the cantilever free to return to its relaxed state, the part will lean toward or away from the base of the cantilever.

Molding Complex Shapes

Cylindrical Backside Pit as Secondary Mold

FIGS. 1A-10D show the molding of a shape where an initial molded part 280 (e.g., diamond) is used as a seed for additional growth in a backside etch pit to form a more complex part 285. Only one such initial part is shown, but it is understood that the technique would normally be applied to a wafer of such parts. FIG. 10A shows molded part 280 in a mold wafer 290 as might have been achieved according to various of the embodiments discussed above. The mold is shown as having been ground and/or polished to a new total thickness and a small pit 295 of arbitrary shape (typically consistent with that available in microlithography) has been made such that it terminates at part 280.

Figure 10A:
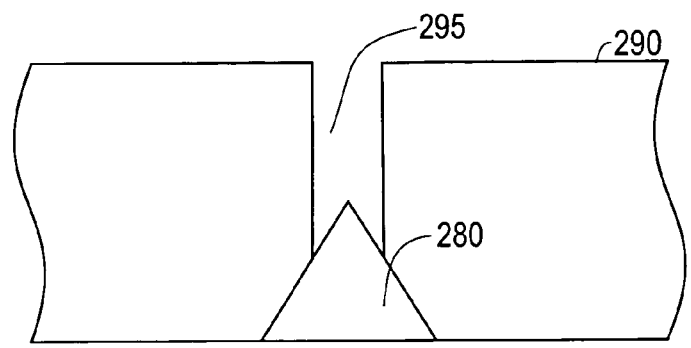
FIGS. 10A-10D show schematic the molding of a shape where a first molded part is used as a seed for additional growth to form a more complex part.
Figure 10B:
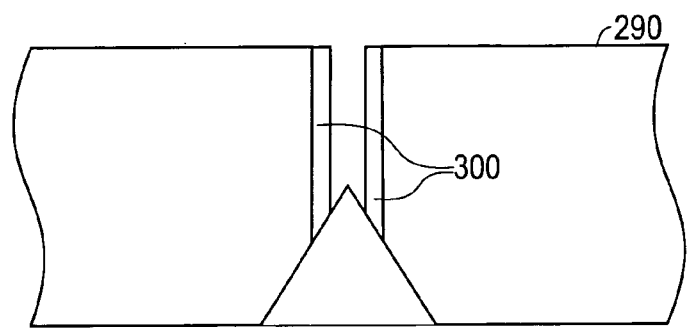
Figure 10C:
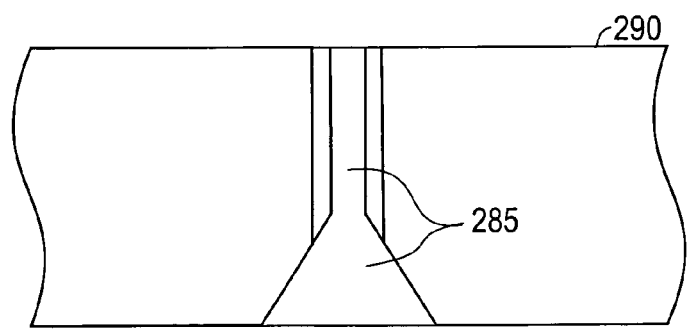
Figure 10D:
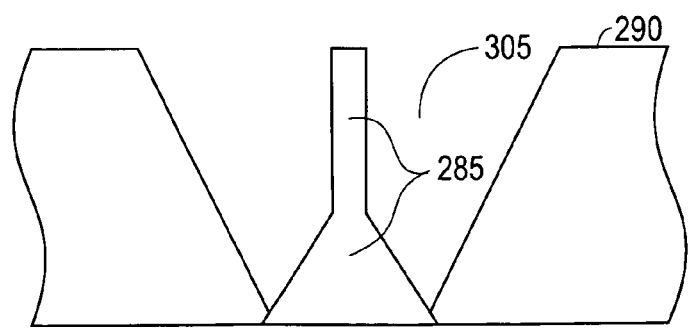

FIG. 10B shows a native oxide layer 300 having been grown on the walls of pit 295, thus possibly making it narrower than is normally available with conventional microlithography. FIG. 10C shows diamond having been grown inside the narrowed pit with molded part 280 acting as a seed, resulting in the more complex molded part 285. FIG. 10D shows the wafer surrounding molded part 285 having been removed as described above in connection with FIGS. 4A-4D by the formation of a release pit 305.

While this technique is not limited to specific dimensions or process parameters, a specific example will be described. After the initial molded part has been formed in cavities in a silicon wafer, the wafer is ground (or the wafer and/or cavities were sized before the molding steps) so that a few microns remain between the molded diamond and opposite side of the wafer. This side is then processed by methods well known in the art including REI etching to make shaped cavities extending down to and/or around the molded diamond part. In particular shapes may be etched including very small diameter shapes typically as small as 200 nm or less and the wall of the resultant shape may be oxidized to substantially reduce the diameter by twice the oxide thickness.

Thus in a typical arrangement a 200-nm hole 1 micron deep etched in silicon may be oxidized to a thickness on the wall of the hole of 2-30 nm, resulting in a hole having a diameter of 196-140 nm opening ending at the point of a four sided molded pyramid formed by growing diamond in an etch terminated silicon mold. The extremely slow silicon oxide growth rate means that it is easy to control pits made at the limits of lithography (today about 50 nm to create open diameters as small as 1 or 2 nm).

The molded diamond point (or alternately a single crystal diamond mechanically embedded in the silicon) then serves as a seed or start point for the growth of diamond the length of the 1 micron shaft to form an integrated molded diamond structure consisting of a pyramid with an integral small diameter molded diamond shape. In preparation before growth of the oxide, the cavity and diamond tip may be etched or chemically cleaned with a silicon carbide etchant (such as a SF6 dry etch) to insure that any remnant carbide formed in the molding process does not interfere with diamond growth. It is important to note that by using the molded or single crystal diamond at the bottom of the cavity as the ONLY seed, CVD or thermal diamond or other seed based diamond growth techniques will not grow diamond elsewhere and will grow in the shaft from the bottom of the diamond terminated shaft to the top.

After the molded diamond in the small diameter shape is grown, the oxide is etched (or chemically removed or subjected to a CMP (chemical mechanical polish) operation), then lithographically exposed to make self-terminated pits which partially or fully clear the pyramidal diamond or seed single crystal diamond. A straight wall or flat topped (shaft end away from the pyramidal diamond or seed diamond can end in a flattened structure of diamond greater in at least one direction then the radius of the shaft structure is particularly well suited to use in AGN, AFM, STM, and other SPM or SPM-related techniques.

Growth in Angled Backside Pit

In yet another embodiment an angled backside pit is made around a previously molded conductive part (e.g., a self-terminated silicon pit mold of diamond, which due to its dopant or contents of sp2 graphitic carbon is conductive). The molded part is connected to voltage source and is charged by the source to be negative with respect to carbon ion species in the plasma of an MPCVD or hot filament or other kind of bulk diamond growth system. Further the bulk silicon mold and previously molded part (e.g., pyramidal diamond form) may be maintained at a temperature such that growth is principally promoted at the sharp edge, tip, or point of the molded part by heat differential maintained by the hot plasma heat transfer to the molded part.

Either latter method may be used alone or in combination to promote rapid growth at the tip of the molded part. Growth is further promoted in this method by the large volume of plasma feed gas able to circulate around the exposed pyramidal tip of diamond. Additionally the bulk silicon may be electrically charged positive with respect to the diamond pyramidal tip by grounding or maintaining a further positive differential voltage. Alternatively a material like tungsten may be coated on the back surface of the silicon mold and the positive voltage or ground may be applied to it while using low conductivity silicon as the mold. Similarly the latter methods may be used on diamond molded forms from sapphire or other substrates similarly prepared and then etched to expose all or part of the molded diamond.

In an embodiment, after the pyramidal or other shape mold pit is prepared, a diamond-like-carbon (DLC) seed layer is coated at high vacuum onto such a wafer from a carbon plasma in a vacuum arc in which the back or handle side of the wafer is fully grounded or even charged negatively with respect to carbon plasma. This can be done by placing a conductive coating (such as aluminum) on the back side and arranging the grounded or negatively charged connection to this side. Additionally the device or silicon layer on top of the stop layer (said silicon relatively thin compared to the handle side and meant to provide mechanical support for the molded part in wafer scale bonding or shipping of the part may be kept at a positive charge or grounded with respect to the handle side bias voltage. A further advantage is the ability to pattern the device layer and etch it such that the formed molded part after the backside etch can be easily removed by mechanical extraction from the mold wafer, while in shipment this breakaway structure prevents inadvertent movement or release of the part.

Ejection from Mold

Figure 11A:
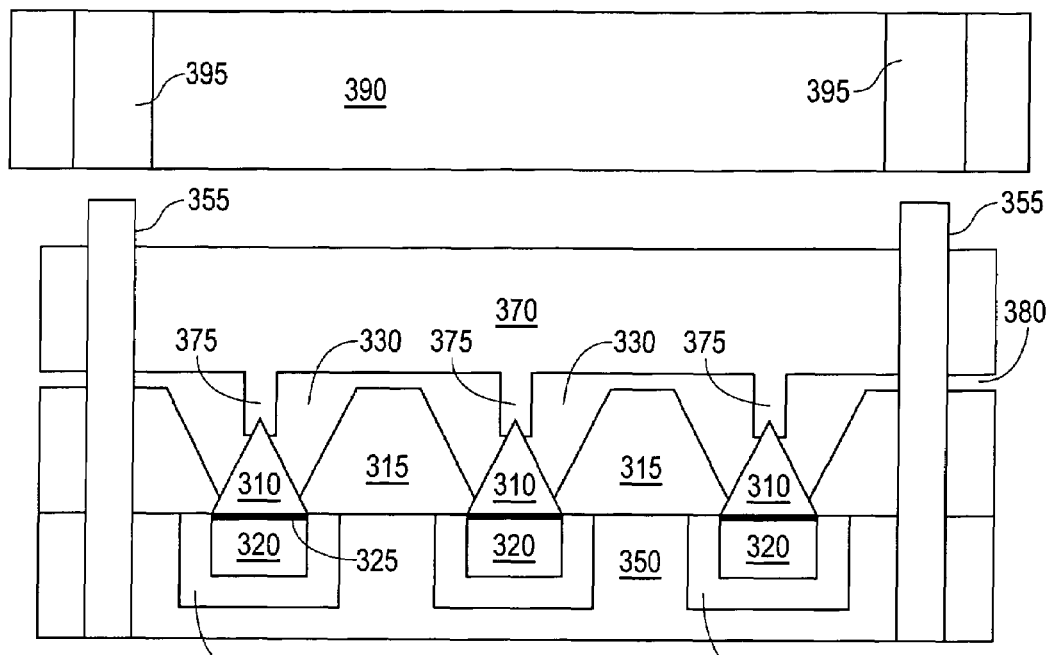
FIGS. 11A and 11B are schematics showing mechanically ejecting molded parts from a mold.
Figure 11B:
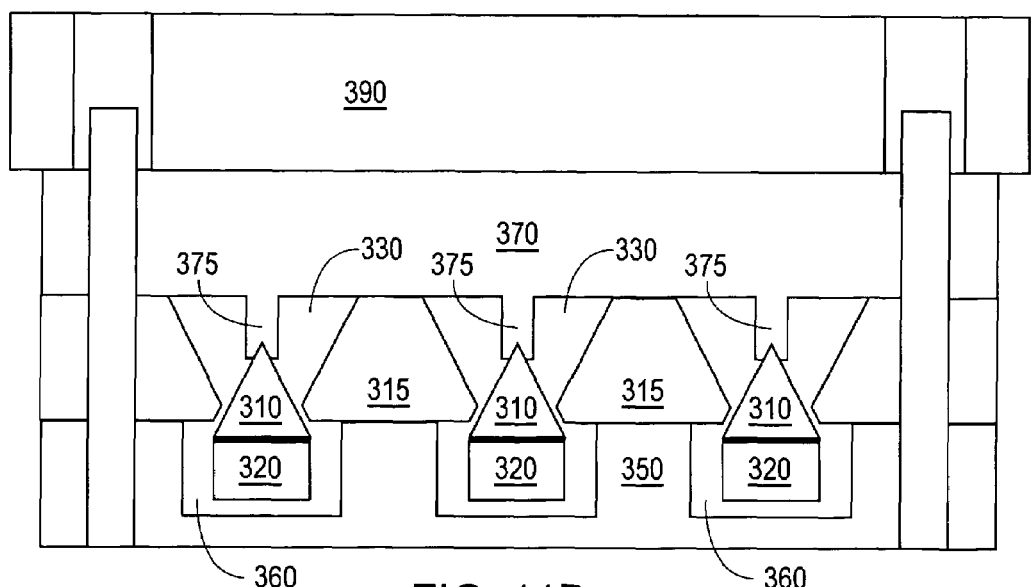

Embodiments of the present invention provide techniques for ejecting molded parts from molds. These embodiments build on the techniques for etching release pits from the backside of the mold wafer Mechanical Ejection FIGS. 11A and 11B are schematics of an apparatus for mechanically ejecting molded parts 310 from a mold 315. The molded parts are shown as having been bonded to support structures 320 with bond material 325. In a specific example, the molded parts are diamond tips, and the support structures are silicon cantilevers that have already been released from their wafer so that they are free to flex. As can be seen, the backside of mold has been etched to form self-terminating release pits 330 that end at a depth slightly less than the mold thickness, leaving a small amount of material around the bases of the molded objects.

FIG. 11A shows the pre-ejection state. Mold 315 (with molded parts 310 and support structures 320) is supported on a base 350 (analogous to base 205 in FIG. 8) with posts 355 (analogous to posts 215 in FIG. 8). Base 350 is formed with recesses 360 to clear support structures 320 (and, to the extent that the molded parts and their support structures are free, to receive the released molded parts after ejection from the mold).

The apparatus comprises, in addition to base 350 and posts 355, a plate 370 having a plurality of projections 375 configured to engage the ends of the molded parts. Plate 370 includes holes to allow the plate to slide along the posts. The projections are sized relative to the plate and the thickness of the mold above the ends of the molded parts so that the projections engage the molded parts while the plate remains a short distance 380 above the backside surface of mold 315. A weight 390 with through holes 395 (recesses would also work) configured to clear posts 355 is shown poised to be lowered onto plate 370.

FIG. 11B shows the state once plate 380 has been lowered onto plate 370. The weight pushes down on plate 370, whose projections 375 exert enough force to break the small amount of mold material around the bases of molded parts 310, and plate 370 comes to rest on mold 315. The distance of travel is limited to prevent damage to the released molded parts and support structures. For example, if support structures 320 are cantilevers that are free to flex, this ensures that the cantilevers are not flexed beyond their limits. In a specific embodiment, plate 370 is a wafer and projections 375 are lithographically formed. They may be coated with silicon nitride.

Hydraulic Ejection

Figure 12A:
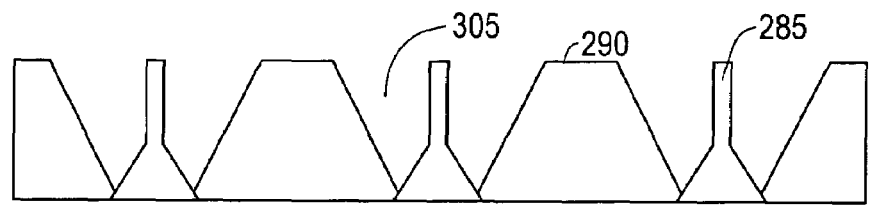
FIGS. 12A-12C are schematics showing hydraulically ejecting molded parts from a mold.
Figure 12B:
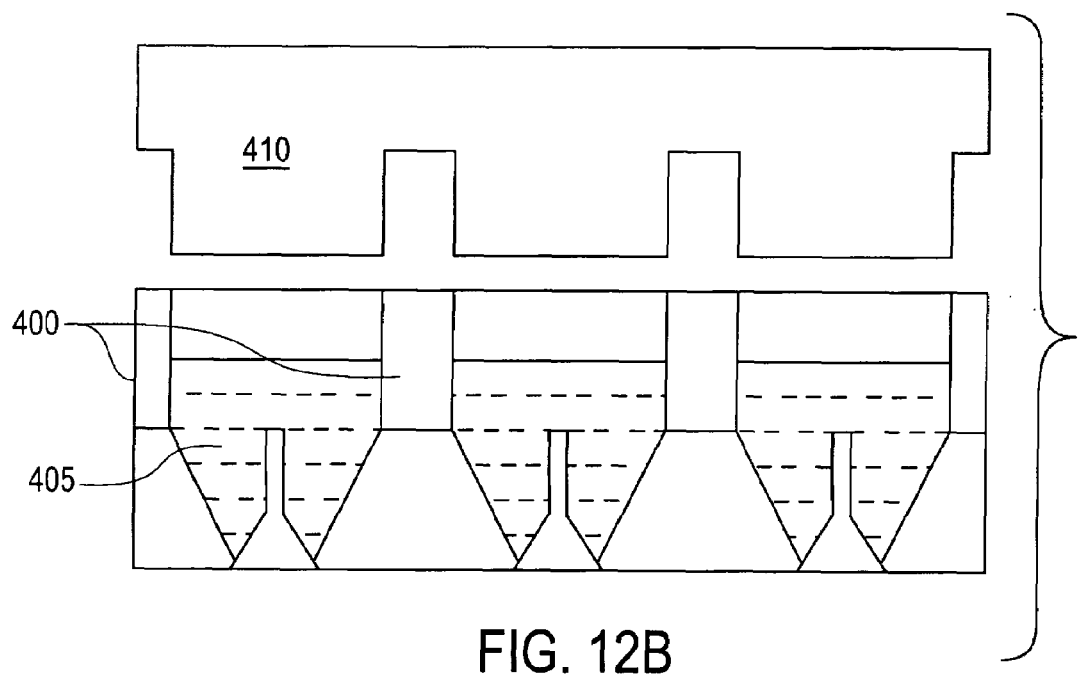
Figure 12C:
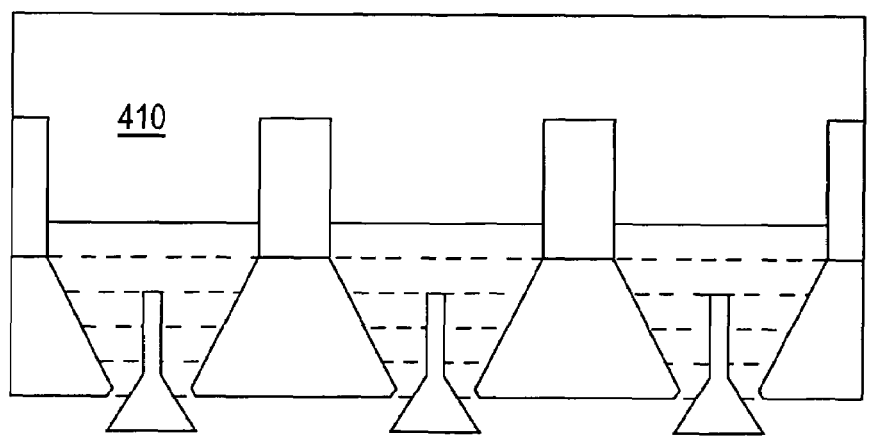

FIGS. 12A-12C are schematics of an apparatus for hydraulically ejecting molded parts from a mold. FIG. 12A shows a mold with molded parts. As an example, the molded parts are shown as the complex parts made as described in connection with FIGS. 10A-10D, and as such, the molded parts are designated with reference numeral 285 and the mold with reference numeral 290. Again, the backside of the mold has been etched to form release pits 305. The hydraulic approach has special advantages for shapes where the upper portion may not be able to withstand the force necessary to release the molded parts using a mechanical force against the top of the molded part. However, the hydraulic approach is applicable to a wide variety of shapes.

FIG. 12B shows a chamber 400 as having been disposed and sealed on the backside of mold 290, and a volume of fluid having been introduced into the reservoir defined by chamber 400 and release pits 305 surrounding molded parts 285. The figure shows a plunger 410 poised above the seals. The fluid is preferably de-ionized water, although other liquids such as alcohols, oils, and unhardened resists might be used under appropriate circumstances.

FIG. 12C shows plunger 410 having been inserted into the reservoir and moved downwardly, thereby exerting sufficient hydraulic force to break the small amount of mold material at the bases of the molded parts. It is noted that a small amount of force on the plunger translates to a magnified force at the bottom of the reservoir due to the much smaller surface area. Plunger 410 is configured for a controlled travel before it engages the top portions of chamber 400. The plunger may be actuated by any convenient mechanism such as a hydraulic pump, a membrane or collapsible chamber, or compressed gas or compressed air such that the pressure is adequate to break or release the part from the mold.

Workpiece Alignment

Figure 13A:
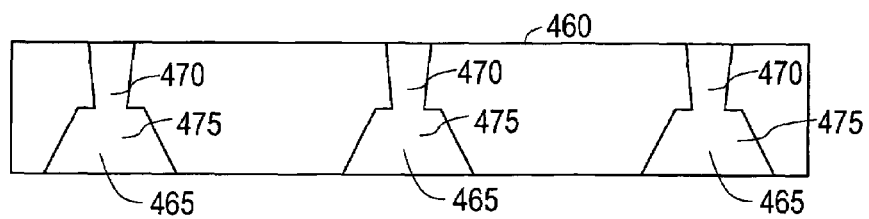
FIGS. 13A-13C are schematic cross-sectional views showing the alignment and separation of a small part from a larger workpiece.
Figure 13B:
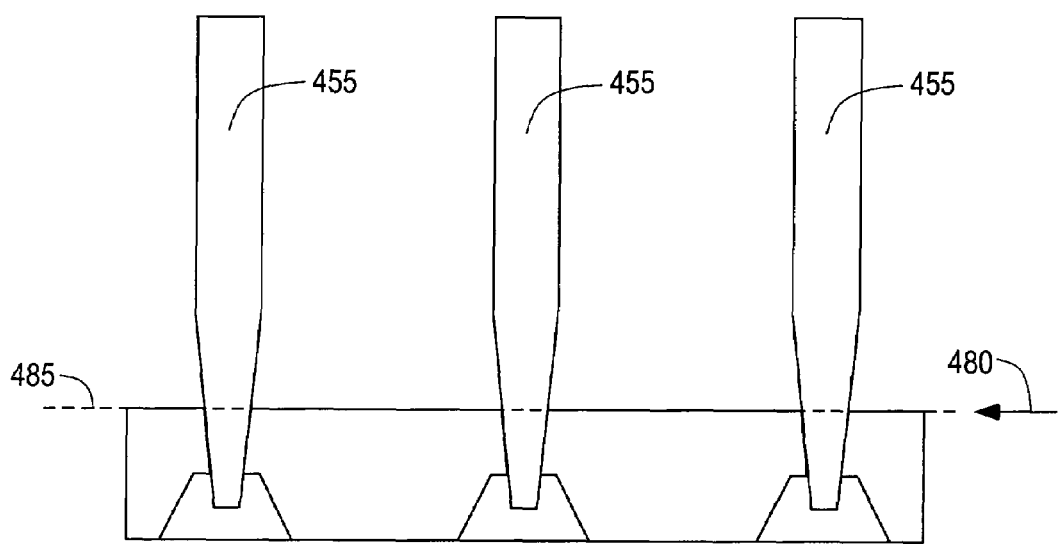
Figure 13C:
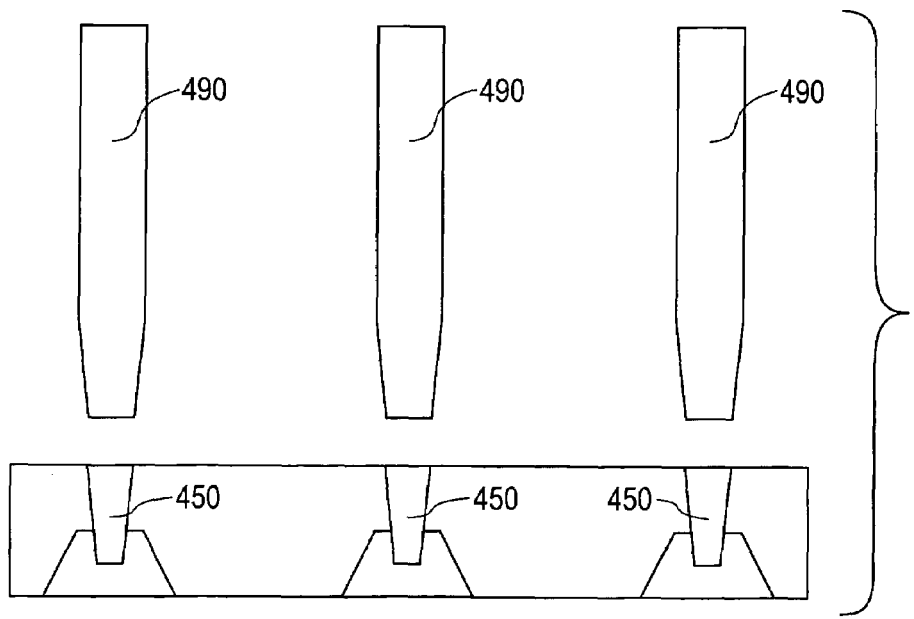

FIGS. 13A-13C are schematic cross-sectional views showing the alignment and separation of a small part 450 from a larger workpiece 455. In an example, the workpiece consists of single-crystal lapped diamond which is oriented in crystal axis to align the shape as a cutting edge with a preferred axis for that cutting operation, such as <100> or <110> or <111> or any particular precise crystal orientation appropriate.

FIG. 13A shows a wafer 460 is provided with a number of recesses 465, each recess having an upper portion 470 and a lower portion 475. Thus the wafer is configured to accept multiple workpieces. Each recess's upper portion 470 is configured to accept a respective workpiece 455 and allow an end portion of the workpiece to pass entirely through the upper portion extend into the recess's lower portion 475, but not exit the bottom surface of the wafer. Each recess's lower portion 475 is configured as a relatively large relief.

FIG. 13B shows multiple workpieces inserted into respective recesses. As can be seen, the very ends of the workpieces are located within the lower portions of the recesses, and are protected by the mold material surrounding the recesses. The figure also shows schematically a parting operation, denoted by an arrow 480, for cutting all the workpieces along a plane 485, denoted by a dashed line. This parting operation may be effected by any convenient mechanism such as a laser cut, an abrasive or lapping cut with a wire or wheel, a chemical etch, or a focused ion beam.

FIG. 13C shows the ends of the workpieces, defining small parts 450, remaining in the wafer while the larger portions 490 of the workpieces having been removed from the vicinity of the wafer. The removed larger portions can have their ends ground or reduced by CMP or other lapping operation to form new workpieces from which the ends can be separated as just described. With the small parts still in the wafer, the entire surface may be given a CMP treatment and/or grind and/or lapping operation such that bond surfaces are smoothed and prepared for coating steps for good adhesion to a metal bond element. In this form these small parts may then be assembled as described above into a complete series of bonded assemblies. The small parts may also be released from wafer 460 and later used with a shaker table or fluid flow system so that they self align into pits or recesses of another alignment wafer.

CONCLUSION

In conclusion it can be seen that the invention provides one or more advantageous techniques, usable individually or in various combinations. These techniques include:

the structured use of a constant change in part depth when creating molded or growth molded otherwise identical in at least one structural element parts for a multiple cavity mold such that a plane can intersect the lowermost portion of the parts, the plane being the tilt angle plane of the final mold opening with respect to the geometry of the parts (including the possibilities that the mold is subsequently machined or ground so as to form a new mold with the plane angle at the mold opening and/or a barrier film has been attached which can prevent the etching process to free up the molded part from causing damage to the bond or other structures attached to the part of adjacent to it); and/or a mold in which the part is released by patterning the mold on the back side away from the part side such that the minimum material is removed sufficient to free up the part while supporting the structure and any barrier film designed to limit the distribution of the etchant; and/or the use of off-axis single crystal mold so as to form a self-terminated pit or structure with a tilt established by the crystal axis; and/or a method of release in which the release etch process is self-terminating on the molded structure itself such that a specific remnant mold material remains and creates a seal to control etchant contamination or dispersal; and/or a mold in which the mold material is removed from most of the part with sufficient material remaining to maintain a barrier to the mold etchant or mold material removal process; and/or inspection or viewing for any purpose of the molded part in the reflective surfaces formed by the removal of the mold material; and/or an alignment system for bonding two wafers at specific bond points with a material which has a specific bonding or welding temperature with a combination of two more sets of self-terminated pits and alignment shapes such that at or near the bond pressure and temperature the bondable elements are brought into contact by the deformation of the alignment shape or deformable coating or both; and/or an assembly means for bonding wafers of parts in which one set are cantilevers such that a preformed jig is used to support the cantilevers for the bonding step (including the possibility of the combination of the jig and the wafer carrying bondable elements to be joined to a cantilever cause the cantilever to bend up or down creating a wedge of the bond material and leaving the part with a characteristic angle due to the bond wedge); and/or a wafer with preshaped pits and any insertion means whereby tool parts loose or on a workpiece are inserted into the wafer, trimmed or released to remain in place and the wafer is then prepared and used for wafer to wafer assembly of the parts; and/or a molded or inserted material means in which a first means is used to mold a base part and then the wafer is prepared by any means including grinding, polishing, compress, or chemical etch and a new pattern etched into the side opposite the first molded parts and/or inserted parts so that these parts form a seed source to fill up the cavities etched on the opposite side from the beginning parts so as to form an complex integral assembly suitable for wafer scale assembly or other use (including the possibility that the parts are made of polycrystalline or single crystal diamond and the wafers are silicon and/or that the etched cavities are decreased in diameter by growth of a native oxide on the silicon and/or that a diamond material is first cleaned by use of a SF6 plasma gas etch to remove any remnant silicon carbide; and/or methods in which the formed diamond, silicon nitride, or silicon carbide molded part is charged negatively with respect to carbon and/or silicon and/or nitrogen ion species in the feed gas; and/or methods in which the surrounding mold backside is charged positively or grounded with respect to the seed ion species (including the possibility that a thermal gradient is maintained to promote differential preferred rates at point or knife edge structures on the molded part); and/or methods of selectively molding diamond, silicon nitride, and silicon carbide in which a stop layer is used to control the depth of the back etch of the mold material; and/or mold seed growth preparation in which the stop layer permits differential charging of etched first molded structure such that seed species are attracted to either the handle or device side of the electrically biased mold form; and/or device side etched patterns in the mold material on the thin or device side of the etch stop layer such that the part may be easily removed from the mold assemble at the end of the process; and/or While the above is a complete description of specific embodiments of the invention, the above description should not be taken as limiting the scope of the invention as defined by the claims.

What is claimed is:

1. A method of making a mold, the method comprising:
   forming a series of cavities in a mold body extending into the mold body at initial angles from an initial reference surface, the series of cavities having depths that vary as a function of position along a direction in the initial reference surface; and
   removing a portion of said mold body adjacent said initial reference surface to define a new reference surface bounding a modified mold body, the new reference surface being non-parallel to the initial reference surface so as to provide a modified series of cavities of equal depth and extending into the modified mold body at modified angles.

2. A method of making a mold, the method comprising:
   providing a mold body having a reference surface;
   forming a plurality of spaced mold cavities in said mold body, said mold cavities
      having respective characteristic axes relative to said reference surface,
      having increasing respective depths below said reference surface as a function of position along a particular direction along said reference surface; and
   removing a portion of said mold body adjacent said reference surface to define a new exposed reference surface of mold body material, wherein:
      said new exposed reference surface is at a non-zero tilt angle to reference surface,
      said new exposed reference surface defines modified mold cavities with respective modified characteristic axes at said tilt angle relative to said new exposed reference surface,
      said modified mold cavities have substantially the same depth relative to said new exposed reference surface, and
      said modified mold cavities have substantially the same extent along at least one direction in said new exposed reference surface.

3. A method of making a mold, the method comprising:
   providing a mold body having a reference surface;
   forming a plurality of spaced mold cavities in said mold body, said mold cavities
      having respective characteristic axes that are parallel to each other,
      having increasing respective depths below said reference surface as a function of position along a particular direction along said reference surface, and having respective deepest portions that are identical; and removing a portion of said mold body adjacent said reference surface to define a new exposed reference surface of mold body material, wherein:
said new exposed reference surface is at a non-zero tilt angle to a surface that is perpendicular to said reference axes,
said new exposed reference surface defines modified mold cavities with respective characteristic axes at said tilt angle relative to said new exposed planar surface,
said modified mold cavities have substantially the same depth relative to said new exposed planar surface, and
said modified mold cavities have substantially the same extent along at least one direction in said new exposed planar surface.

4. The method of claim 3 wherein said reference surface is a planar surface.

5. The method of claim 3 wherein:
said reference surface is a planar surface that is perpendicular to said respective characteristic axes of said mold cavities;
said mold cavities are pyramidal and geometrically similar to each other but of different sizes; and
said modified mold cavities are substantially identical.

6. A method of making a mold, the method comprising:
providing a mold body having a reference plane;
forming a plurality of spaced mold cavities in said mold body, said mold cavities
having geometrically similar pyramidal shapes, and
having increasing respective depths below said reference plane as a function of position along a particular direction along said reference surface; and removing a portion of said mold body adjacent said reference surface to define a new exposed planar surface of mold body material, wherein:
said new exposed planar surface is at a non-zero tilt angle with respect to said reference plane, and
said new exposed planar surface defines modified mold cavities that have substantially the same shape and depth.

7. The method of claim 6 wherein:
each mold cavity has a square opening in said reference plane;
each mold cavity has a vertex that is disposed on a respective line that is perpendicular to the reference plane and passes through the center of that mold cavity's square opening; and
each modified mold cavity has a non-rectangular quadrilateral opening in said new exposed planar surface.

8. The method of claim 6 wherein:
each mold cavity has a rectangular opening in said reference plane;
each mold cavity has a vertex that is disposed on a respective line that is perpendicular to the reference plane and passes through the center of that mold cavity's rectangular opening; and
each modified mold cavity has a non-rectangular quadrilateral opening in said new exposed planar surface.

* * * * *